(12) United States Patent  
Yuan et al.

(10) Patent No.: US 8,480,192 B2
(45) Date of Patent: Jul. 9, 2013

(54) ENCLOSURE WITH SLIDE ASSEMBLIES

(75) Inventors: Guang-Dong Yuan, Shenzhen (CN); Hai-Qing Zhou, Shenzhen (CN); Chung-Chi Huang, Taipei Hsien (TW)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 279 days.

(21) Appl. No.: 12/975,289

(22) Filed: Dec. 21, 2010

(65) Prior Publication Data

US 2012/0133261 A1 May 31, 2012

(30) Foreign Application Priority Data

Nov. 26, 2010 (CN) .......................... 2010 1 0560965

(51) Int. Cl.
*A47B 91/00* (2006.01)
(52) U.S. Cl.
USPC ............... 312/351.11; 312/249.8; 361/679.59
(58) Field of Classification Search
USPC .................. 312/249.1, 249.8, 249.9, 249.11, 312/249.12, 249.13, 223.1, 223.2, 351.1, 312/351.9, 351.11, 351.12; 361/679.59; 16/18 R, 45, 46, 47, 48, 23, 28, 29, 30, 32, 33, 34, 16/31 R, 31 A, 40, 43, 44; 248/637, 646, 248/647, 649, 651, 652, 653, 664, 673, 677, 248/188, 188.1, 188.6, 188.8; 280/30
See application file for complete search history.

(56) References Cited

U.S. PATENT DOCUMENTS

| 814,562 | A | * | 3/1906 | Peters ............................... 16/34 |
| 1,058,837 | A | * | 4/1913 | Zikmund ........................... 16/34 |
| 1,145,096 | A | * | 7/1915 | Thomes ............................. 16/32 |
| 1,341,384 | A | * | 5/1920 | Sabom .............................. 16/34 |
| 4,719,663 | A | * | 1/1988 | Termini ............................ 16/30 |
| 5,253,389 | A | * | 10/1993 | Colin ................................ 16/30 |
| 5,365,635 | A | * | 11/1994 | Jang ................................. 16/34 |
| 5,584,546 | A | * | 12/1996 | Gurin et al. .................. 312/200 |
| 5,590,938 | A | * | 1/1997 | De Andrea ................. 312/257.1 |
| 6,478,315 | B1 | * | 11/2002 | Manesis .......................... 280/37 |
| 6,594,856 | B1 | * | 7/2003 | Cherukuri ......................... 16/34 |
| 7,360,783 | B2 | * | 4/2008 | Home ............................ 280/639 |
| 8,141,885 | B2 | | 3/2012 | Fan et al. |
| 2005/0217071 | A1 | * | 10/2005 | Shinner ............................. 16/19 |

FOREIGN PATENT DOCUMENTS

| CN | 2458909 Y | 11/2001 |
| CN | 201331727 Y | 10/2009 |
| TW | M377346 U | 4/2010 |

* cited by examiner

*Primary Examiner* — James O Hansen
*Assistant Examiner* — Sasha T Varghese
(74) *Attorney, Agent, or Firm* — Altis Law Group, Inc.

(57) ABSTRACT

An enclosure includes a bottom plate, and a plurality of slide assemblies fixed to the bottom plate. Each of the plurality of slide assemblies includes a fixed member fixed to the bottom plate, and a rotary member rotatably received in the fixed member. The rotary member includes first and second fixed portions, and a wheel. The first fixed portion is fixed to the second fixed portion, the second fixed portion is connected to the fixed member, and the wheel is fixed to the first fixed portion. Each rotary member is operable to be in a first position to expose the respective wheel for moving the enclosure, and in a second position to be received in the respective fixed member.

15 Claims, 10 Drawing Sheets

ENCLOSURE WITH SLIDE ASSEMBLIES

BACKGROUND

1. Technical Field

The present disclosure relates to an enclosure with slide assemblies, which may be used for an electronic device.

2. Description of Related Art

As is well known, most electronic devices such as computers have enclosures to contain electronic elements. When the enclosure is to be relocated, the enclosure requires considerable handling. Such operations are inconvenient.

Therefore, an enclosure is desired to overcome the limitations described.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION

Figure 1:
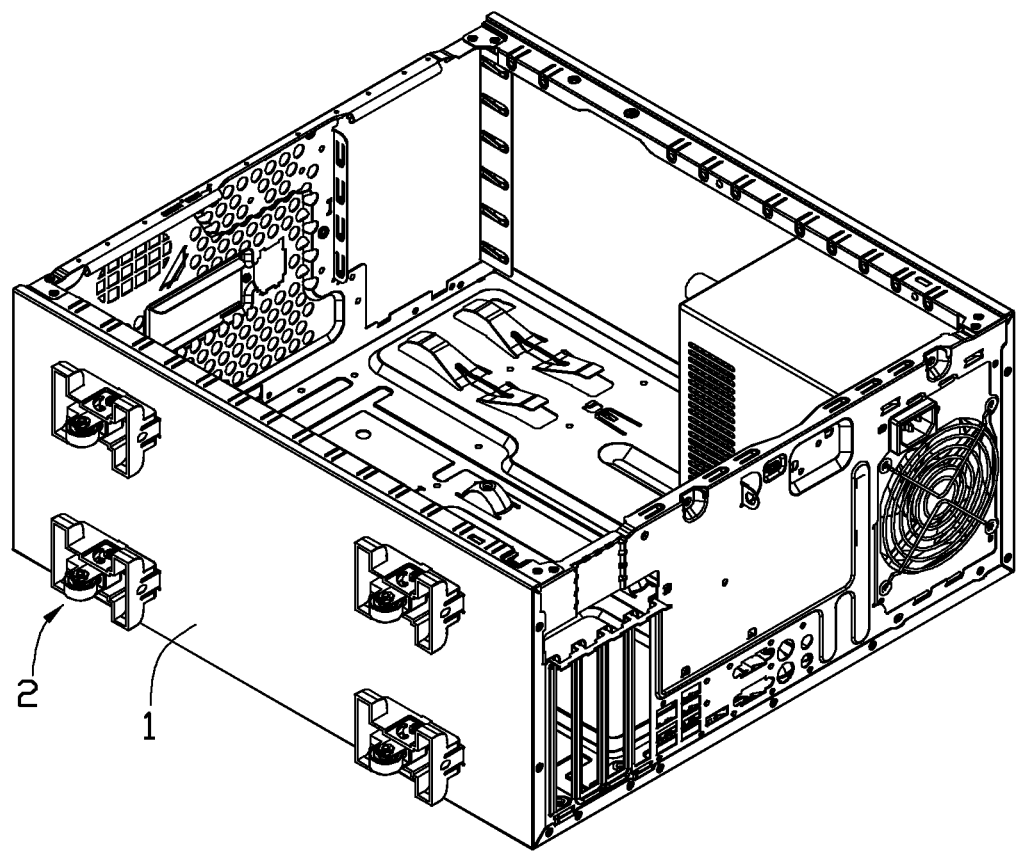
FIG. 1 is an assembled, isometric view of an enclosure according to an exemplary embodiment.
Figure 2:
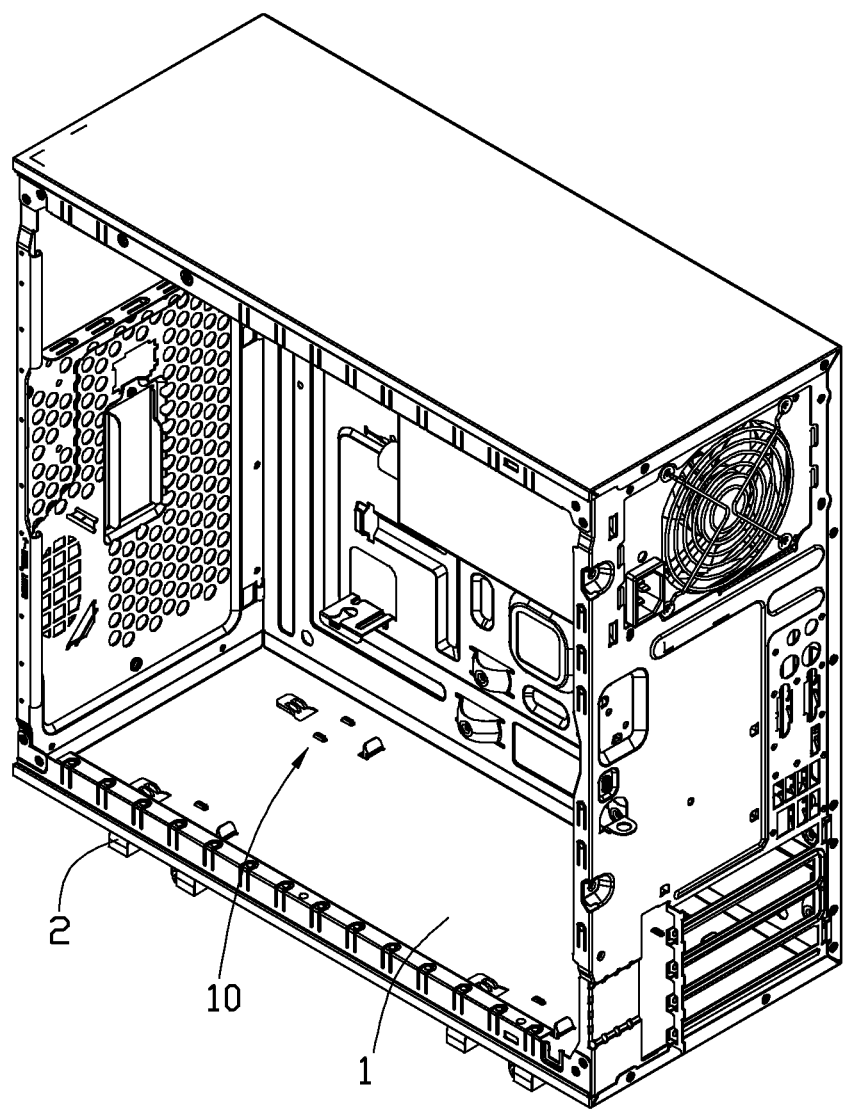
FIG. 2 is an assembled, isometric view of FIG. 1, but viewed from another aspect.
Figure 3:
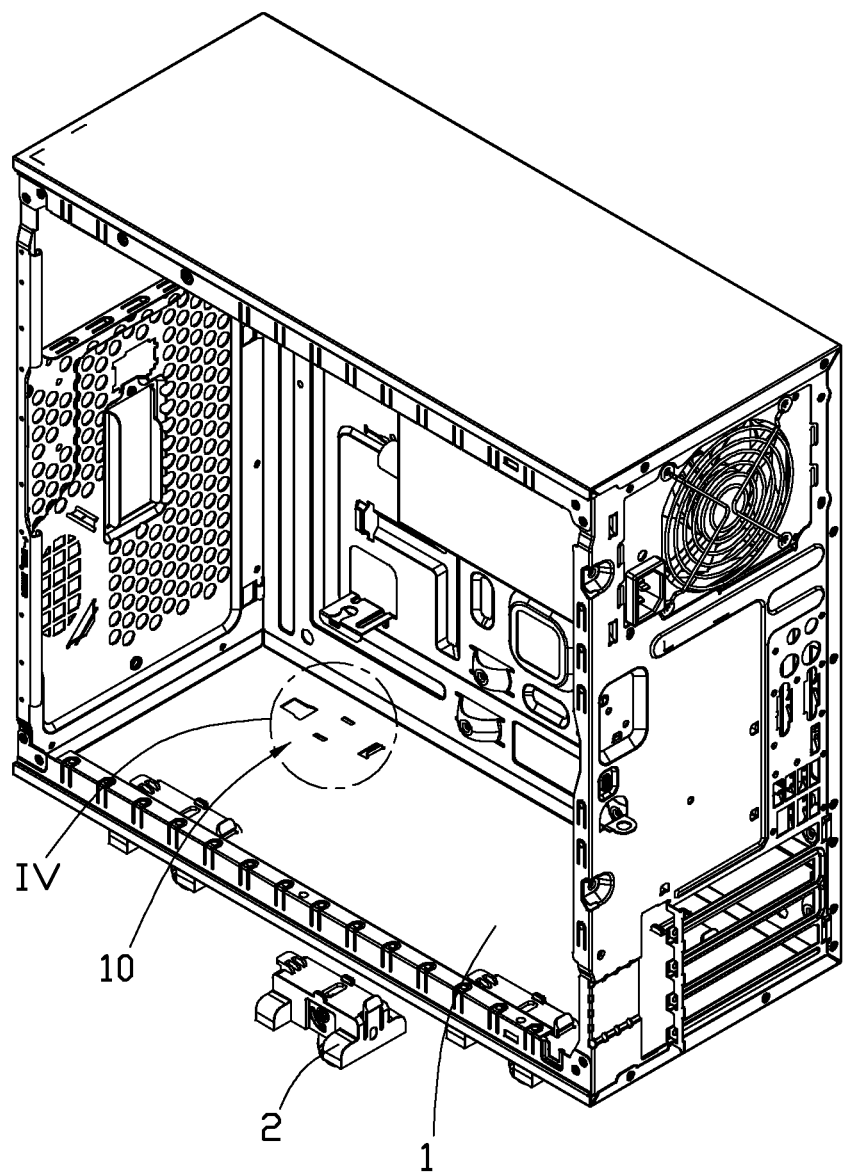
FIG. 3 is a partially exploded, isometric view of FIG. 2.
Figure 4:
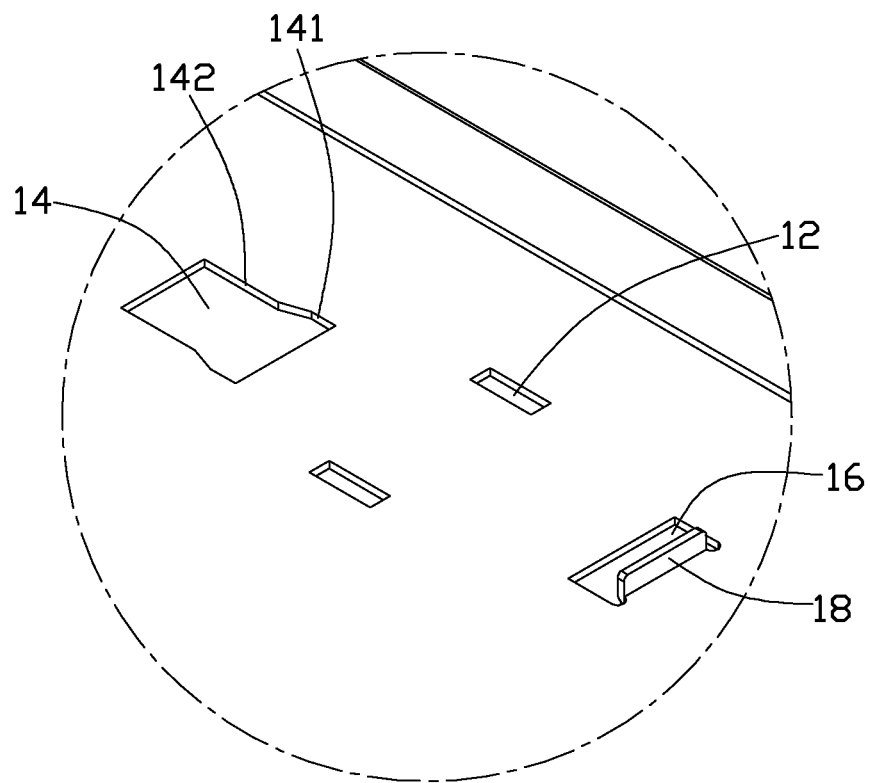
FIG. 4 is an enlarged view of an encircled portion IV of FIG. 3.
Figure 5:
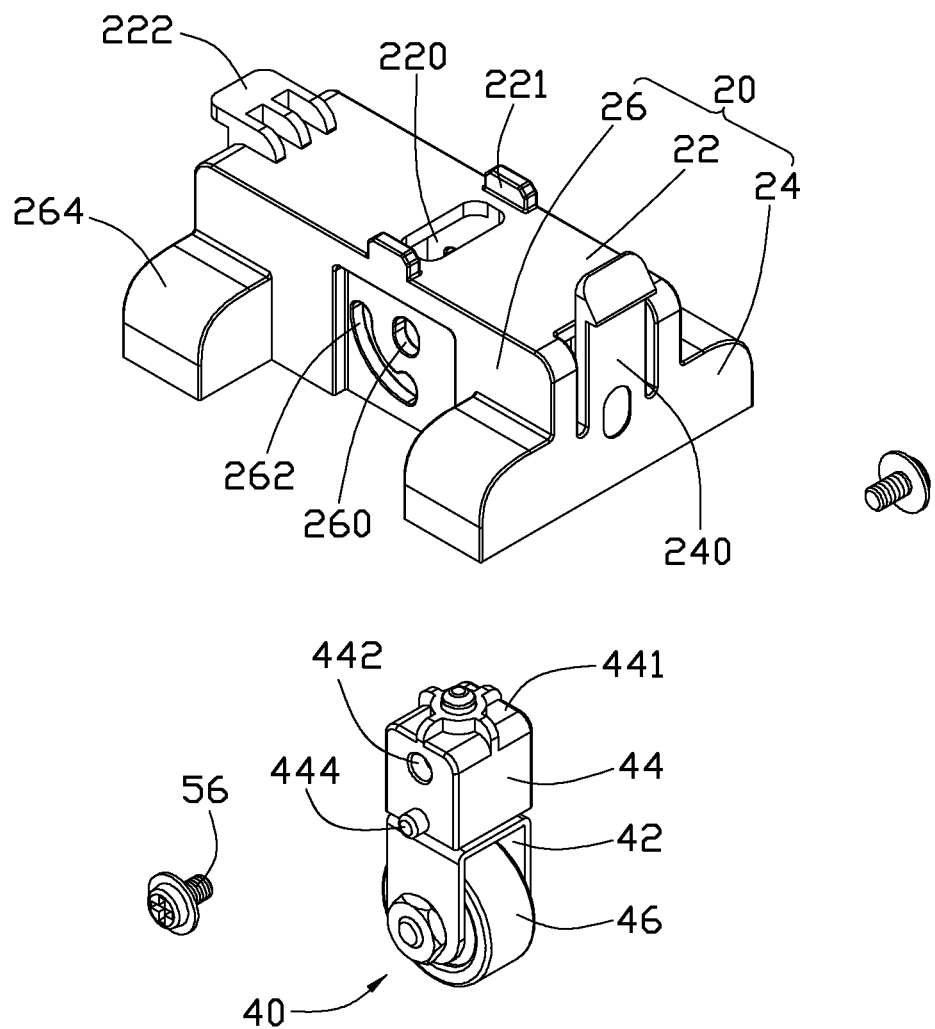
FIG. 5 is a partially exploded, isometric view of one of a plurality of slide assemblies of the enclosure of FIG. 1.
Figure 6:
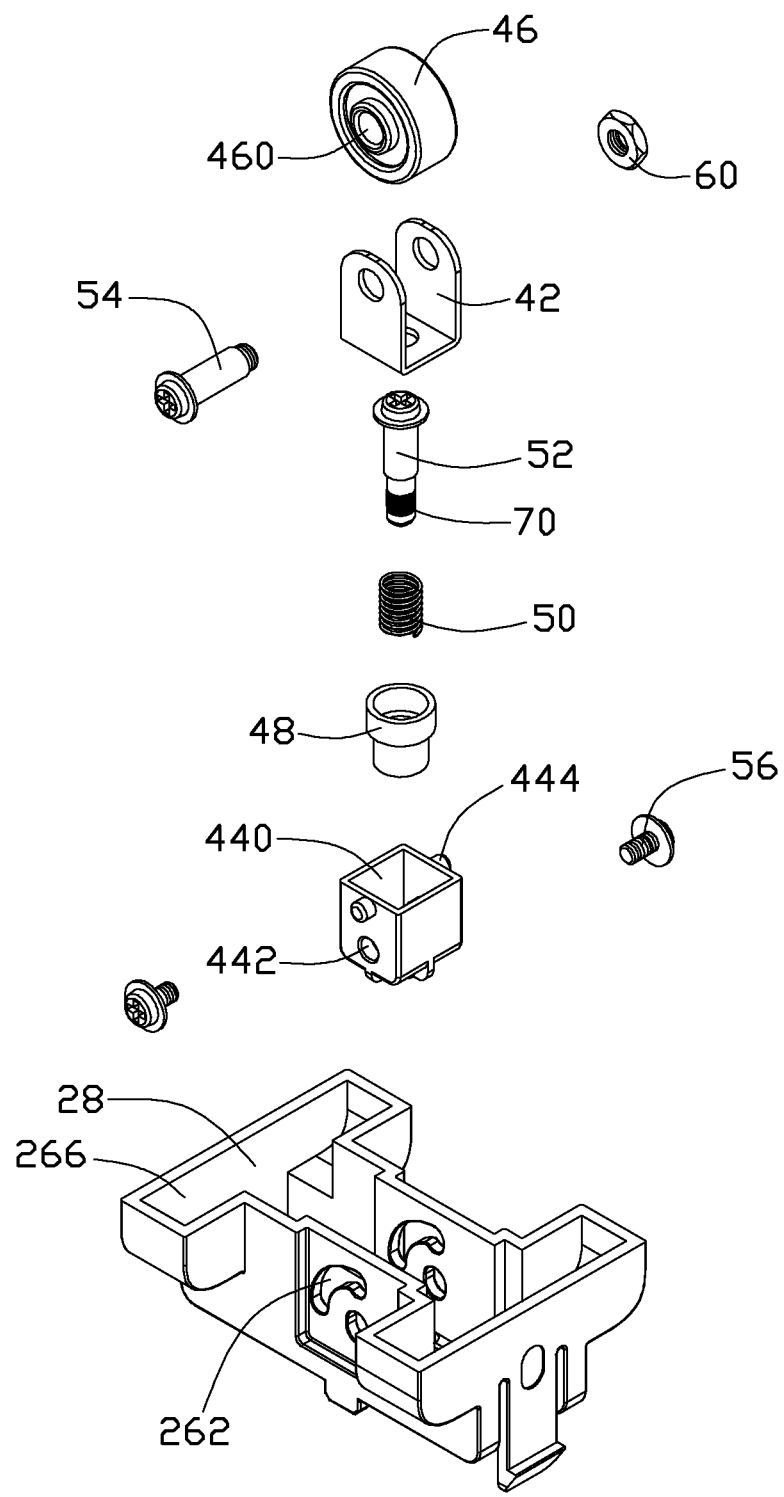
FIG. 6 is an exploded, isometric view of FIG. 5, but viewed from another aspect.
Figure 7:
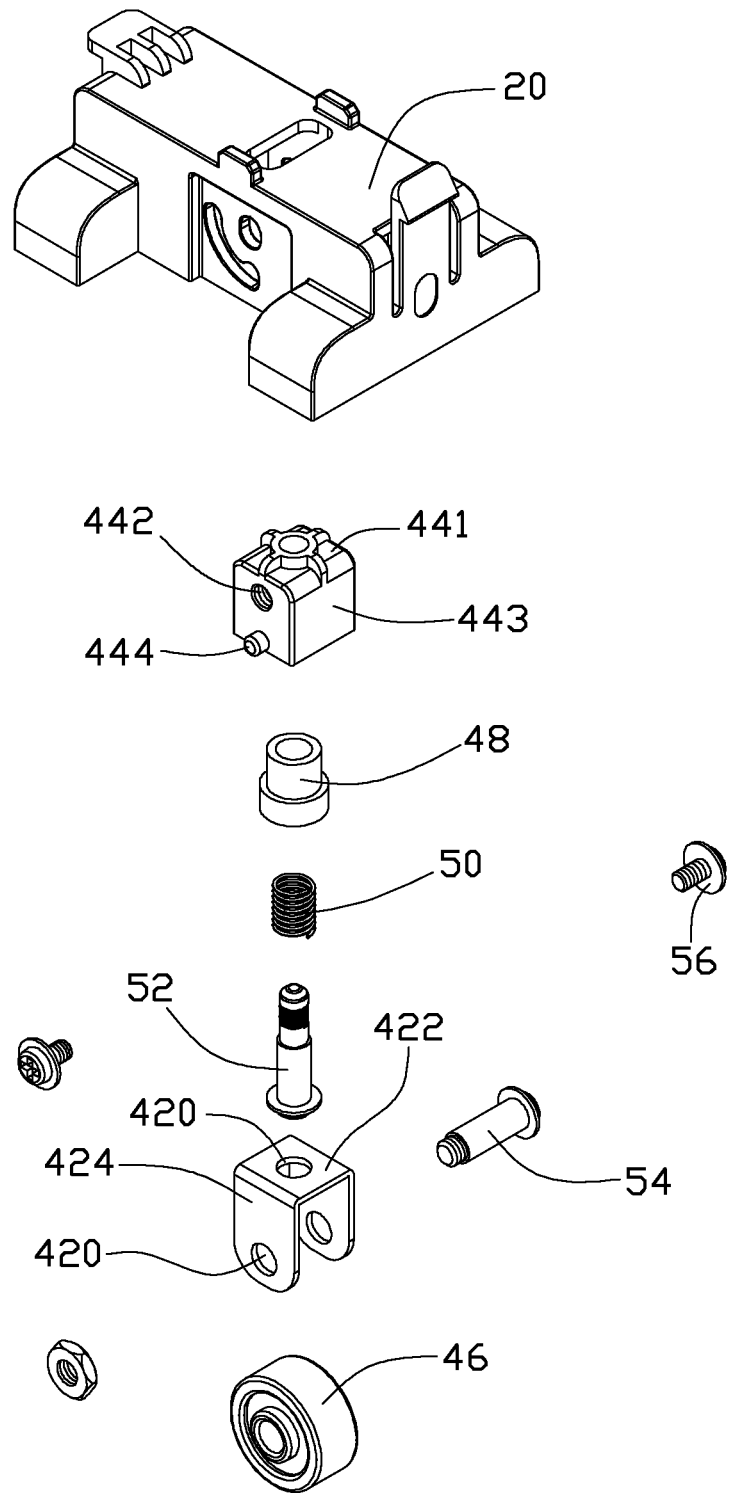
FIG. 7 is an exploded, isometric view of FIG. 5.
Figure 8:
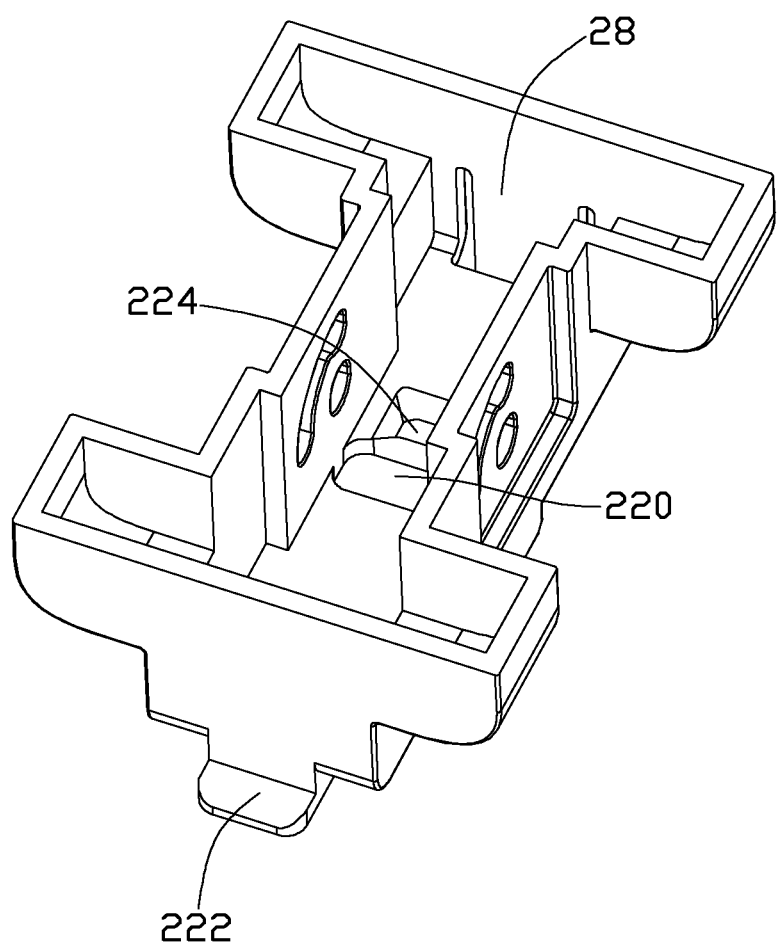
FIG. 8 is an enlarged view of a fixed member of FIG. 5, but viewed from another aspect.

Referring to FIGS. 1-4, an enclosure according to an exemplary embodiment is shown. The enclosure includes a bottom plate 1, and a plurality of slide assemblies 2 fixed to the bottom plate 1.

The bottom plate 1 includes a plurality of fixed sections 10 corresponding to the plurality of slide assemblies 2. Each of the plurality of fixed sections 10 includes two latching slots 12 defined in two sides thereof, a first opening 14, and a second opening 16 defined in two ends thereof respectively. A block plate 18 extends upward from an edge of the second opening 16 away from the first opening 14. The first opening 14 includes a first portion 141 and a second portion 142. A width of the first portion 141 exceeds a width of the second portion 142.

Referring to FIGS. 5-8, each of the plurality of slide assemblies 2 includes a H-shaped hollow fixed member 20 and a rotary member 40 rotatably received in a middle of the fixed member 20.

The fixed member 20 includes a top plate 22, two end walls 24 depending from two ends of the top plate 22, and two sidewalls 26 depending from two sides of the top plate 22. The top plate 22 includes a third opening 220 defined in a middle thereof, two protrusions 221 extending from an outer side thereof, and a trapezoid block 224 fixed to an inner side thereof. The two protrusions 221 and the trapezoid block 224 are positioned close to the third opening 220. One of the two end walls 24 includes a T-shaped raised member 222 extending upward therefrom, and the other of the two end walls 24 includes a latching member 240 extending upward therefrom. An outer surface of each of the two sidewalls 26 defines a concave portion in a middle thereof. The concave portion defines a first through hole 260 and a curved slot 262 therein. The curved slot 262 is substantially a quarter circle curved and arranged in a same circle, a center of which is a center of the first through hole 260. A top end of the curved slot 262 and the first through hole 260 are positioned on the same plane. A bottom end of the curved slot 262 is positioned below the first through hole 260. Two raised portions 264 extend from two ends of each of the two sidewalls 26. Each of the two raised portions 264 defines a cavity 266 therein. The top plate 22, the two end walls 24, and the two sidewalls 26 cooperatively define a first receiving space 28 therebetween. The first receiving space 28 communicates with the cavity 266.

The rotary member 40 includes a first fixed portion 42, a second fixed portion 44, a wheel 46, a shockproof bushing 48, a spring 50, and a plurality of fastening means. The first fixed portion 42 is substantially U-shaped and includes a connection plate 422 and two support plates 424 extending from two ends of the connection plate 422. The connection plate 422 and each of the two support plates 424 respectively define a second through hole 420 therein. The second fixed portion 44 includes a top portion 441 and four side plates 443 extending from four edges of the top portion 441. The top portion 441 and each of two of the four side plates 443 respectively define a threaded hole 442 therein. The top portion 441 and the four side plates 443 cooperatively define a second receiving space 440 therebetween. Two fixed pins 444 are fixed on two of the four side plates 443. Each of the two fixed pins 444 is positioned below the threaded hole 442 of each of two of the four side plates 443. The wheel 46 includes a third through hole 460 defined midway therein. The plurality of fastening means is a first fastener 52, a second fastener 54, and two third fasteners 56. Each of the four fasteners 52, 54, 56 includes a threaded portion 70 fixed on a distal end thereof.

During assembly of the first fixed portion 42 to the second fixed portion 44, the spring 50 is partially received in the shockproof bushing 48, and the shockproof bushing 48 is received in the second receiving space 440 of the second fixed portion 44 by the first fastener 52 passing through the second through hole 420 of the connection plate 422, the spring 50, the shockproof bushing 48, and the threaded hole 442 of the top portion 441 from bottom to top. The distal end of the first fastener 52 then extends from the threaded hole 442. Accordingly, the first fixed portion 42 and the second fixed portion 44 can be rotatably fixed to each other.

During assembly of the wheel 46 to the first fixed portion 42, the wheel 46 is received between the two support plates 424, and the second fastener 54 passes through the second through hole 420 of each of the two support plates 424, the third through hole 460 of the wheel 46, and a threaded retaining member 60. Accordingly, the wheel 46 and the first fixed portion 42 can be rotatably fixed to each other.

Figure 9:
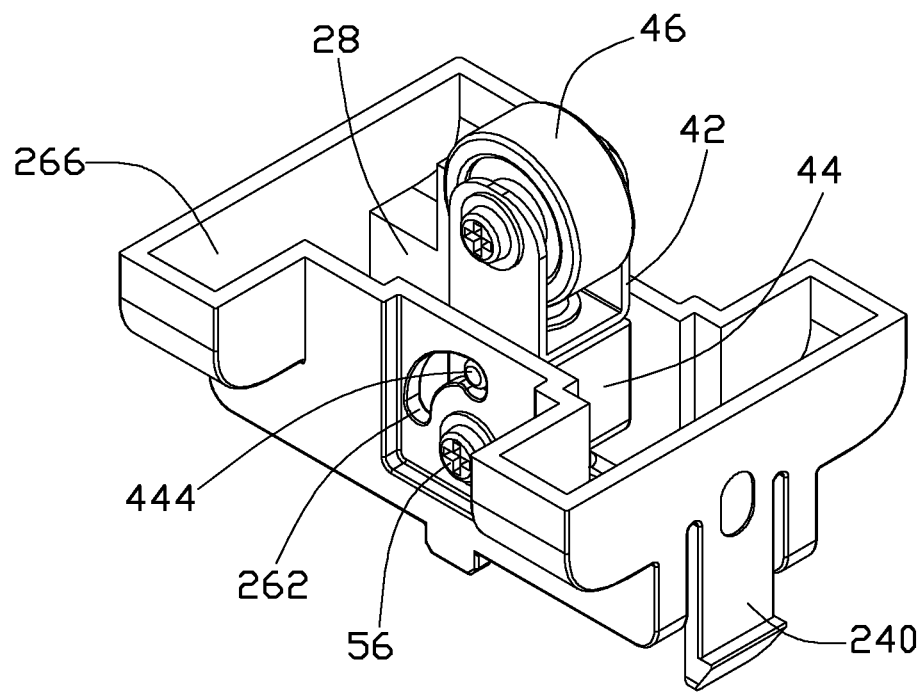
FIG. 9 is an assembled, isometric view of FIG. 6, showing an unfolded state of one of the slide assemblies.

Referring to FIG. 9, during assembly of the rotary member 40 to the fixed member 20, the second fixed portion 44 of the rotary member 40 is received in the first receiving space 28 of the fixed member 20, the second fixed portion 44 abuts the trapezoid block 224, and the distal end of the first fastener 52 is aligned with the third opening 220 of the fixed member 20, and each of the two fixed pins 444 is received in the curved slot 262. Each of the two third fasteners 56 then passes through the first through hole 260 of the fixed member 20, and the threaded hole 442 of the four side plates 443. Accordingly, the rotary member 40 and the fixed member 20 can be rotatably fixed to each other.

During assembly of each of the plurality of slide assemblies 2 to each of the plurality of fixed sections 10 of the bottom plate 1, the raised member 222 of the fixed member 20 passes through the first portion 141 of the first opening 14, and finally abuts the second portion 142 of the first opening 14. The latching member 240 passes through the second opening 16 and abuts the block plate 18 by elastic deformation of the latching member 240. The two protrusions 221 are then received in the two latching slots 12. Accordingly, the plurality of slide assemblies 2 and the bottom plate 1 can be fixed to each other.

Figure 10:
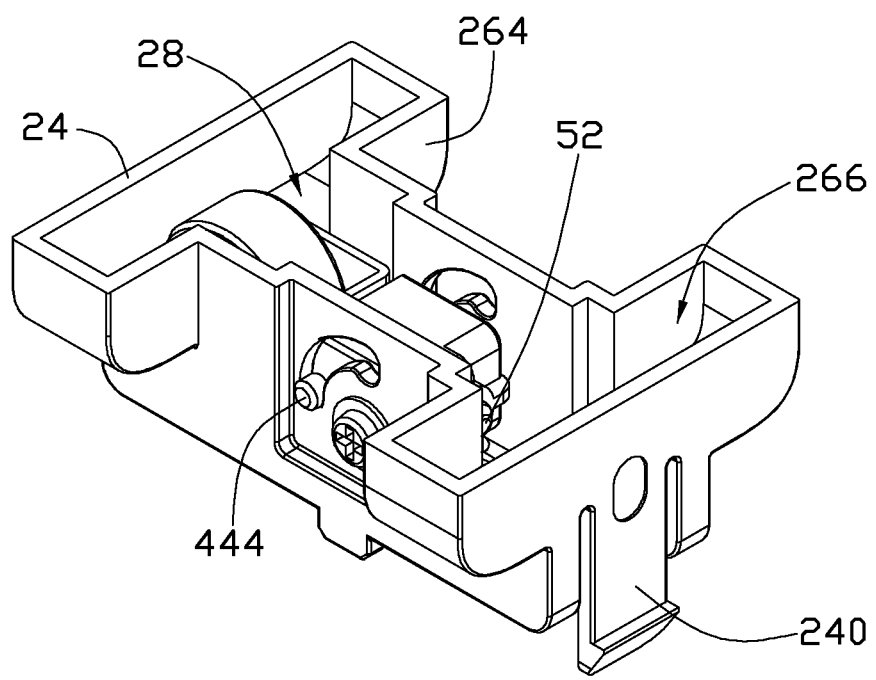
FIG. 10 is an assembled, isometric view of FIG. 6, showing a folded state of one of the slide assemblies.

Referring to FIG. 10, when the enclosure is to be fixed, the distal end of the first fastener 52 moves away from the trapezoid block 224 by outward rotation of the first fastener 52, the first fixed portion 42 is positioned close to the second fixed portion 44 by elastic deformation of the spring 50, and each of the two fixed pins 444 of the rotary member 40 slides toward the top plate 22 of the fixed member 20 until reaching the top end of the curved slot 262. Thus, the wheel 46 is received in the first receiving space 28 and abuts an inner side of one of the two end walls 24 and the enclosure is supported by the fixed member 20, i.e., the rotary member 40 is operable to be in a second position to be received in the fixed member 20.

When the enclosure is to be relocated, each of the two fixed pins 444 of the rotary member 40 slides away from the top plate 22 of the fixed member 20 until reaching the bottom end of the curved slot 262. The distal end of the first fastener 52 moves close to the trapezoid block 224 by inward rotation of the first fastener 52 to maintain each of the two fixed pins 444 at the bottom end of the corresponding curved slot 262. Therefore, the wheel 46 extends from the first receiving space 28, and the enclosure is supported by the wheel 46, i.e., the rotary member 40 is operable to be in a first position to expose the wheels 46 for moving the enclosure.

While the disclosure has been described by way of example and in terms of preferred embodiment, it is to be understood that the disclosure is not limited thereto. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An enclosure, comprising:
a bottom plate; and
a plurality of slide assemblies fixed to the bottom plate, each comprising:
a fixed member fixed to the bottom plate; and
a rotary member rotatably received in the fixed member, wherein the rotary member comprises first and second fixed portions and a wheel, the first fixed portion being fixed to the second fixed portion, the second fixed portion being connected to the fixed member, and the wheel being fixed to the first fixed portion;
wherein the rotary member is operable to be in a first position to expose the wheel for moving the enclosure, and in a second position to be received in the fixed member;
wherein the fixed member comprises a top plate, two end walls depending from two ends of the top plate, and two sidewalls depending from two sides of the top plate;
the top plate, the end walls and the sidewalls bounding a receiving space to receive the rotary member, two protrusions extending from the top plate and being engaged in the bottom plate, and a trapezoid block being fixed to an inner side of the top plate.

2. The enclosure of claim 1, wherein the bottom plate comprises a plurality of fixed sections corresponding to the plurality of slide assemblies, wherein each of the plurality of fixed sections comprises two latching slots to engage with the protrusions of a corresponding one of the slide assemblies.

3. The enclosure of claim 2, wherein the bottom plate defines a first opening and a second opening at two ends of the latching slots, respectively, one of the two end walls comprises a raised member extending upward therefrom, and the other one of the two end walls comprises a latching member extending upward therefrom, wherein the raised member is received in the first opening, and the latching member is received in the second opening.

4. The enclosure of claim 1, wherein each of the two sidewalls defines a concave portion in a middle thereof, and wherein the concave portion defines a first through hole and a curved slot therein.

5. The enclosure of claim 4, wherein the curved slot is substantially a quarter circle, arc-shaped, and arranged in a circle, a center of which is coincident with a center of the first through hole, and wherein a top end of the curved slot and the first through hole are positioned at the same plane, and a bottom end of the curved slot is positioned below the first through hole.

6. The enclosure of claim 5, wherein the first fixed portion is substantially U-shaped and comprises a connection plate and two support plates extending from two ends of the connection plate, respectively, and wherein the connection plate and each of the two support plates respectively define a second through hole therein; wherein the second fixed portion comprises a top portion and four side plates extending from four edges of the top portion, and wherein the top portion and each of two of the four side plates respectively define a threaded hole therein.

7. The enclosure of claim 6, wherein the wheel comprises a third through hole defined midway therein, and wherein the wheel and the first fixed portion are rotatably fixed to each other whereby the wheel is received between the two support plates, and a first fastener passes through the second through hole of each of the two support plates, the third through hole, and a threaded retaining member.

8. The enclosure of claim 6, wherein the rotary member further comprises a shockproof bushing and a spring, wherein the first fixed portion and the second fixed portion are rotatably fixed to each other by a second fastener passing through the second through hole of the connection plate, the spring, the shockproof bushing, and the threaded hole of the top portion.

9. The enclosure of claim 8, wherein each of the two of the four side plates comprises a fixed pin fixed thereon, and wherein the rotary member and the fixed member are rotatably fixed to each other by each of the fixed pins being received in the corresponding curved slot, and each of two third fasteners passing through the respective first through hole of the fixed member, and the respective threaded hole of the respective side plate.

10. The enclosure of claim 1, wherein each of the two sidewalls of the fixed member defines a through hole therein, the second fixed portion comprises a top portion and four side plates extending from four edges of the top portion, and the rotary member and the fixed member are rotatably fixed to each other by two fasteners passing through the through holes of the fixed member to be engaged in two opposite ones of the side plates of the second fixed portion.

11. The enclosure of claim 10, wherein each of the two sidewalls of the fixed member defines a curved slot therein, each curved slot is substantially a quarter circle, arc-shaped, and arranged in a circle, a center of which is coincident with a center of the corresponding through hole, and wherein a top end of the curved slot and the through hole are positioned at the same plane, a bottom end of the curved slot is positioned below the through hole, and a fixed pin extends from each of the two opposite ones of the side plates of the second fixed portion to be movably received in the corresponding curved slot.

12. The enclosure of claim 11, wherein each fixed pin reaches the bottom end of the corresponding curved slot, in response to the corresponding rotary member being in a first position to expose the corresponding wheel for moving the enclosure, and reaches the top end of the corresponding curved slot, in response to the corresponding rotary member being in a second position to be received in the corresponding fixed member.

13. The enclosure of claim 1, wherein the first fixed portion is substantially U-shaped and comprises a connection plate and two support plates extending from two ends of the connection plate, respectively, the wheel is sandwiched between the support plates, and a first fastener passes through one of the support plates, the wheel, the other support plate, and a threaded retaining member, to rotatably mount the wheel to the first fixed portion.

14. The enclosure of claim 13, wherein the second fixed portion comprises a top portion and four side plates extending from four edges of the top portion, and a second fastener passing through the connection plate and the top portion of the second fixed portion, to rotatably mount the first fixed portion to the second fixed portion.

15. The enclosure of claim 14, wherein the rotary member further comprises a shockproof bushing and a spring, and the second fastener passes through the connection plate, the spring, the shockproof bushing, and the top portion of the second fixed portion.

\* \* \* \* \*